United States Patent  (10) Patent No.: US 8,115,287 B2
Camacho et al.  (45) Date of Patent: Feb. 14, 2012

(54) INTEGRATED CIRCUIT PACKAGING SYSTEM WITH DUAL ROW LEAD-FRAME HAVING TOP AND BOTTOM TERMINALS AND METHOD OF MANUFACTURE THEREOF

(75) Inventors: Zigmund Ramirez Camacho, Singapore (SG); Abelardo Jr. Hadap Advincula, Singapore (SG); Erwin Aguas Sangalang, Singapore (SG); Lionel Chien Hui Tay, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 243 days.

(21) Appl. No.: 12/635,699

(22) Filed: Dec. 10, 2009

(65) Prior Publication Data

US 2011/0140252 A1 Jun. 16, 2011

(51) Int. Cl.
 *H01L 23/495* (2006.01)
(52) U.S. Cl. ........... 257/676; 257/666; 257/E21.506; 438/123; 438/109
(58) Field of Classification Search .......... 257/676, 257/666, E21.506, E23.031, 777, 686, 787; 438/123, 109, 112, 124, 127
See application file for complete search history.

(56) References Cited

U.S. PATENT DOCUMENTS

| | | | |
|---|---|---|---|
| 6,710,246 B1 | 3/2004 | Mostafazadeh et al. | |
| 6,730,544 B1 | 5/2004 | Yang | |
| 6,781,243 B1 * | 8/2004 | Li et al. | 257/777 |
| 7,045,396 B2 | 5/2006 | Crowley et al. | |
| 8,018,036 B2 * | 9/2011 | Goh et al. | 257/676 |
| 2005/0001294 A1 * | 1/2005 | Li et al. | 257/666 |
| 2006/0175688 A1 | 8/2006 | Jang | |
| 2007/0114641 A1 | 5/2007 | Goh et al. | |
| 2008/0157302 A1 | 7/2008 | Lee et al. | |

* cited by examiner

*Primary Examiner* — Roy Potter
(74) *Attorney, Agent, or Firm* — Mikio Ishimaru

(57) ABSTRACT

A method of manufacture of an integrated circuit packaging system includes: forming outer leads having outer terminal sections, the outer terminal sections having an upper terminal and a bottom terminal; forming inner leads having inner terminal sections wider than a distance between the outer terminal sections of the outer leads, and the inner terminal sections have an upper terminal and a bottom terminal; connecting an integrated circuit to the inner leads and the outer leads; and encapsulating the integrated circuit, the inner leads, and the outer leads with an encapsulation while leaving the upper terminals and the bottom terminals of the outer terminal sections and the upper terminals and bottom terminals of the inner terminal sections exposed from the encapsulation.

20 Claims, 7 Drawing Sheets

INTEGRATED CIRCUIT PACKAGING SYSTEM WITH DUAL ROW LEAD-FRAME HAVING TOP AND BOTTOM TERMINALS AND METHOD OF MANUFACTURE THEREOF

TECHNICAL FIELD

The present invention relates generally to an integrated circuit packaging system, and more particularly to a system for utilizing a dual row lead-frame having top and bottom terminals.

BACKGROUND

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming outer leads having outer terminal sections, the outer terminal sections having an upper terminal and a bottom terminal; forming inner leads having inner terminal sections wider than a distance between the outer terminal sections of the outer leads, and the inner terminal sections have an upper terminal and a bottom terminal; connecting an integrated circuit to the inner leads and the outer leads; and encapsulating the integrated circuit, the inner leads, and the outer leads with an encapsulation while leaving the upper terminals and the bottom terminals of the outer terminal sections and the upper terminals and bottom terminals of the inner terminal sections exposed from the encapsulation.

The present invention provides an integrated circuit packaging system including: outer leads that have outer terminal sections, the outer terminal sections have an upper terminal and a bottom terminal; inner leads that have inner terminal sections wider than a distance between the outer terminal sections of the outer leads, and the inner terminal sections have an upper terminal and a bottom terminal; an integrated circuit connected to the inner leads and the outer leads; and an encapsulation encapsulating the integrated circuit, the inner leads, and the outer leads and the upper terminals and the bottom terminals of the outer terminal sections and the upper terminals and bottom terminals of the inner terminal sections are exposed from the encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
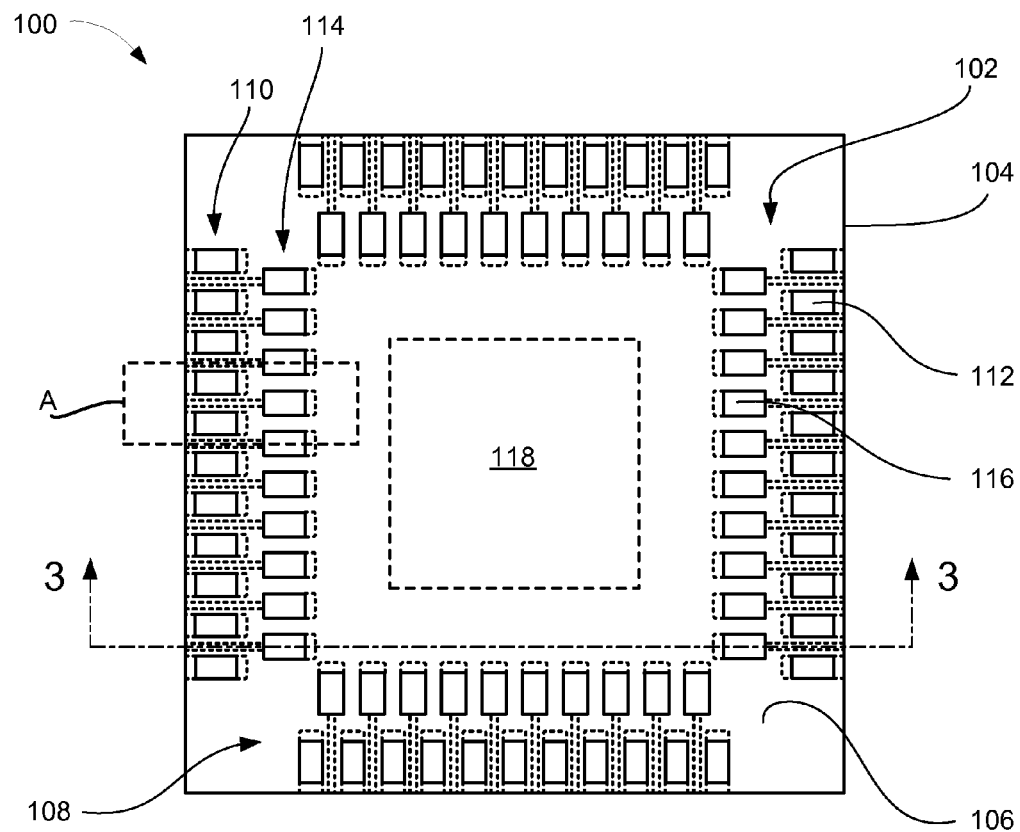
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the die-attach-paddle, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in an embodiment of the present invention. The integrated circuit packaging system 100 is shown having an encapsulation 102 with a perimeter 104 and a top surface 106. Encapsulated by the encapsulation 102 are leads 108.

The leads 108 are arranged in two rows such as an outer row 110 that contains outer leads 112. The outer row 110 is arranged along the perimeter 104 of the encapsulation 102 and circumscribes an inner row 114 of leads 108. The inner row 114 contains inner leads 116. A die-attach-paddle 118 is also encapsulated by the encapsulation 102.

Figure 2:
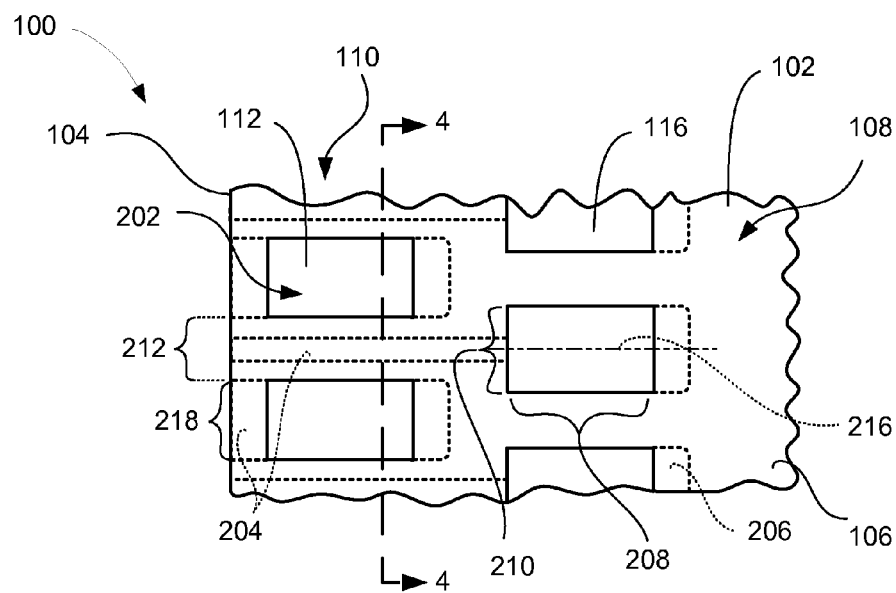
FIG. 2 is the magnified region A of the integrated circuit packaging system of FIG. 1.

Referring now to FIG. 2, therein is shown the magnified region A of the integrated circuit packaging system 100 of FIG. 1. The integrated circuit packaging system 100 is shown having the leads 108 magnified for greater detail. The leads 108 are shown having terminal sections 202 such as outer terminal sections on the outer leads 112 and inner terminal sections on the inner leads 116.

The terminal sections 202 are shown exposed from the top surface 106 of the encapsulation 102. The leads 108 also have connecting bars 204 which connect the terminal sections 202 to the perimeter 104 of the encapsulation 102. Formed on an opposite side of the leads 108 are bonding tips 206. From above, the terminal sections 202 are shown having a length 208 longer than a width 210. The bonding tips 206 are pictured as substantially rectangular with rounded corners and with a width substantially similar to the width 210 of the terminal sections 202.

The outer row 110 has a distance 212 between the terminal sections 202 of the outer leads 112 that is less than the width 210 of the terminal sections 202 of the inner leads 116. The terminal sections 202 of the inner leads 116 are further from the perimeter 104 of the encapsulation 102 than are the bonding tips 206 of the outer leads 112.

It has been discovered that the density of terminal sections 202 can be greatly increased without sacrificing valuable terminal section area for external connections. By increasing the density of the terminal sections 202 greater input/output signal capacity can be achieve in smaller package forms.

It has further been discovered that the increase in density does not come at the expense of terminal section area, this has the exceedingly beneficial result that the packages utilizing the present invention may be connected to external packages with current technology leading to substantial cost savings to implement the present invention. Also, the large terminal section area also reduces parasitic inductance and resistance which hinders performance of miniaturized connections.

Thus, it has been discovered that the performance enhancements of the present invention are a valuable advancement in the integrated circuit packaging design art, while offering solutions to many problems encountered when attempting to increase input/output signal density.

One method discovered for implementing the present invention is to form the connecting bars 204 of the inner leads 116 smaller than the distance 212 between the terminal sections 202 of the outer leads 112.

The terminal sections 202 of the inner leads 116 are situated evenly on each side of a centerline 216 of the connecting bars 204 on the inner leads 116. The connecting bars 204 of the outer leads 112 are substantially the same width 218 as the terminal sections 202 of the outer leads 112 and extend toward the perimeter 104 of the encapsulation 102 in a straight path.

Figure 3:
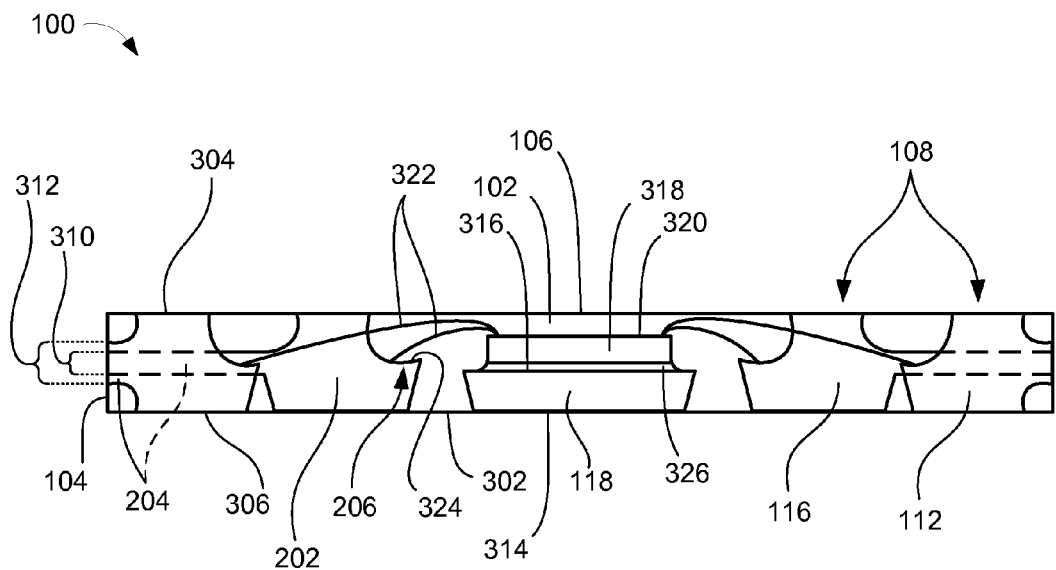
FIG. 3 is a cross-sectional view of the integrated circuit packaging system along the line 3-3 of FIG. 1.

Referring now to FIG. 3, therein is shown a cross-sectional view of the integrated circuit packaging system 100 along the line 3-3 of FIG. 1. The integrated circuit packaging system 100 is shown having the terminal sections 202 of the leads 108 exposed from the top surface 106 and from a bottom surface 302 of the encapsulation 102.

The portion of the terminal sections 202 exposed from the top surface 106 of the encapsulation 102 is an upper terminal 304, while the portion of the terminal sections 202 exposed from the bottom surface 302 is a bottom terminal 306.

Near an edge of the upper terminal 304, the leads 108 transition toward the bonding tips 206 with a non-linear slope such as a concave or convex curve. Similarly, near an opposite edge of the upper terminal 304, the leads 108 transition down toward the connecting bars 204 with a non-linear slope.

Near an edge of the bottom terminal 306, the leads 108 transition toward the bonding tips 206 with a linear slope such as a slope from the bottom terminal 306 inclining toward the die-attach-paddle 118. Near an edge of the bottom terminal 306, the inner leads 116 transition toward the connecting bars 204 with a linear slope away from the die-attach-paddle 118. Near an edge of the bottom terminal 306, the outer leads 112 transition toward the connecting bars 204 with a non-linear slope toward the perimeter 104 of the encapsulation 102. The bottom terminal 306 is longer than the length of the upper terminal 304, and extends closer to the edge of the bonding tips 206 than the upper terminal 304.

Along the perimeter 104 of the encapsulation 102, a height 310 of the connecting bars 204 on the inner leads 116 is smaller than a height 312 of the connecting bars 204 on the outer leads 112. Further, the connecting bars 204 on the inner leads 116 are substantially centerline to the connecting bars 204 on the outer leads 112, meaning that the connecting bars 204 on the outer leads 112 are evenly proportioned above and below the connecting bars 204 on the inner leads 116.

The die-attach-paddle 118 is shown having a bottom 314 and a top 316. The bottom 314 of the die-attach-paddle 118 is exposed from the bottom surface 302 of the encapsulation 102. Near an edge of the bottom 314, the die-attach-paddle 118 transitions toward the top 316 with a linear slope toward the perimeter 104 of the encapsulation 102.

Above the die-attach-paddle 118 is an integrated circuit 318 with an active side 320 facing away from the die-attach-paddle 118. The active side 320 of the integrated circuit 318 is connected to the leads 108 with an interconnect such as bond wires 322. The bond wires 322 are connected to the bonding tips 206 at a wire bonding surface 324.

The wire bonding surface 324 is below a surface on the connecting bars 204 that transition toward the upper terminal 304. The integrated circuit 318 is attached to the die-attach-paddle 118 with die attach adhesive 326. Encapsulating the integrated circuit 318 and the bond wires 322 is the encapsulation 102.

Figure 4:
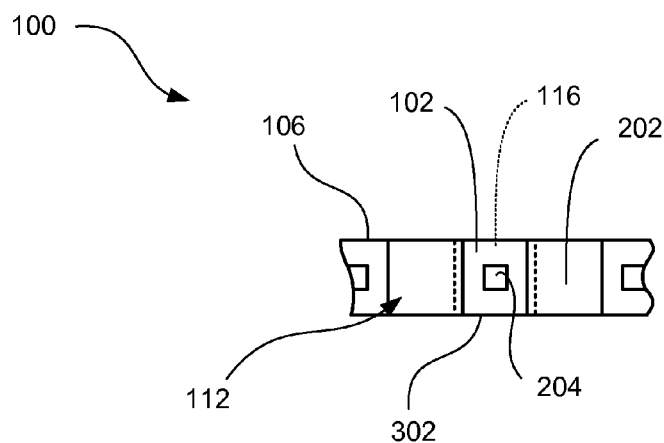
FIG. 4 is a cross-sectional view of the integrated circuit packaging system along the line 4-4 of FIG. 2.

Referring now to FIG. 4, therein is shown a cross-sectional view of the integrated circuit packaging system 100 along the line 4-4 of FIG. 2. The integrated circuit packaging system 100 is shown having the terminal sections 202 of the outer leads 112 exposed from the top surface 106 and the bottom surface 302 of the encapsulation 102. The terminal sections 202 of the outer leads 112 are also shown having a substantially rectangular cross-section perpendicular to the length of the terminal sections 202.

The connecting bar 204 of the inner lead 116 is also shown, and is equidistant from the terminal sections 202 of the outer leads 112 and is also equidistant from the top surface 106 and the bottom surface 302 of the encapsulation 102. The connecting bar 204 of the inner lead 116 is also shown having a substantially rectangular cross-section perpendicular to the length of the connecting bars 204 of the inner leads 116.

Figure 5:
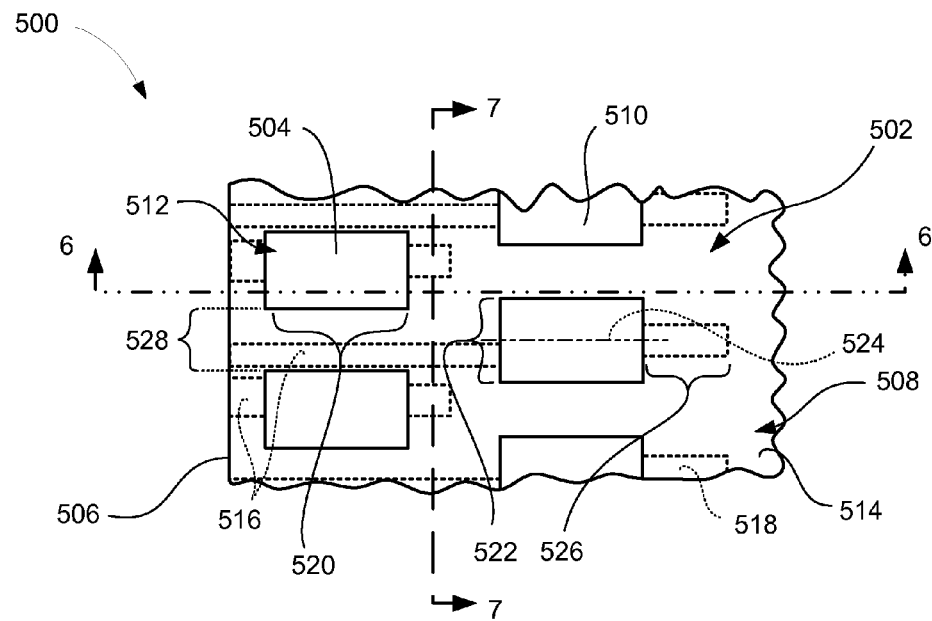
FIG. 5 is a magnified region of a top view of an integrated circuit packaging system in an embodiment of the present invention.

Referring now to FIG. 5, therein is shown a magnified region of a top view of an integrated circuit packaging system 500 in an embodiment of the present invention. The integrated circuit packaging system 500 is shown having leads 502 such as outer leads 504 near a perimeter 506 of an encapsulation 508, and inner leads 510 further away from the perimeter 506 of the encapsulation 508.

The leads 502 have terminal sections 512. The terminal sections 512 are shown exposed from a top surface 514 of the encapsulation 508. The leads 502 also have connecting bars 516 which connect the terminal sections 512 to the perimeter 506 of the encapsulation 508. Formed on an opposite side of the leads 502 are bonding tips 518. From above, the terminal sections 512 are shown having a length 520 and a width 522.

The bonding tips 518 and the connecting bars 516 on the outer leads 504 are formed off center of a centerline 524 of the terminal sections 512. The connecting bars 516 of the inner leads 510 are also formed offset from the centerline 524 of the terminal sections 512. Conversely, the bonding tips 518 on the inner leads 510 are formed along the center line 524 of the terminal sections 512.

From the top, the bonding tips 518 of the outer leads 504 are pictured as substantially square with square corners and with a width substantially similar to a length 526 of the bonding tips 518 but substantially smaller than the width 522 of the terminal sections 512. The bonding tips 518 of the inner leads 510 are pictured as substantially rectangular with square corners and with a width substantially smaller than the length 526 of the bonding tips 518 and the width 522 of the terminal sections 512.

From above, the terminal sections 512 transition perpendicularly toward the bonding tips 518 and the connecting bars 516. Aiding the flexibility of the terminal sections 512 design, the length 526 of the bonding tips 518 on the inner leads 510 is longer than the length 526 of the bonding tips 518 on the outer leads 504.

It has been discovered that along with a density increase of terminal sections 512, offsetting the terminal sections 512 from the centerline 524 and varying the length 526 of the bonding tips 518 allows the terminal sections 512 to be designed to interface with various input/output connection layouts. Thus, the present invention increases density while retaining a high degree of design flexibility. This provides substantial cost reductions allowing the use of a standard integrated circuit with a new external interface or vice versa without having to design routing lines or signal distribution layers.

The outer leads 504 have a distance 528 between the terminal sections 512 that is less than the width 522 of the terminal sections 512 of the inner leads 510. The terminal sections 512 of the inner leads 510 are further from the perimeter 506 of the encapsulation 508 than are the bonding tips 518 of the outer leads 504. The connecting bars 516 of the inner leads 510 are smaller than the distance 528 between the terminal sections 512 of the outer leads 504.

The connecting bars 516 of the outer leads 504 are substantially smaller than the width 522 of the terminal sections 512 of the outer leads 504 and extend toward the perimeter 506 of the encapsulation 508 in a straight path.

Figure 6:
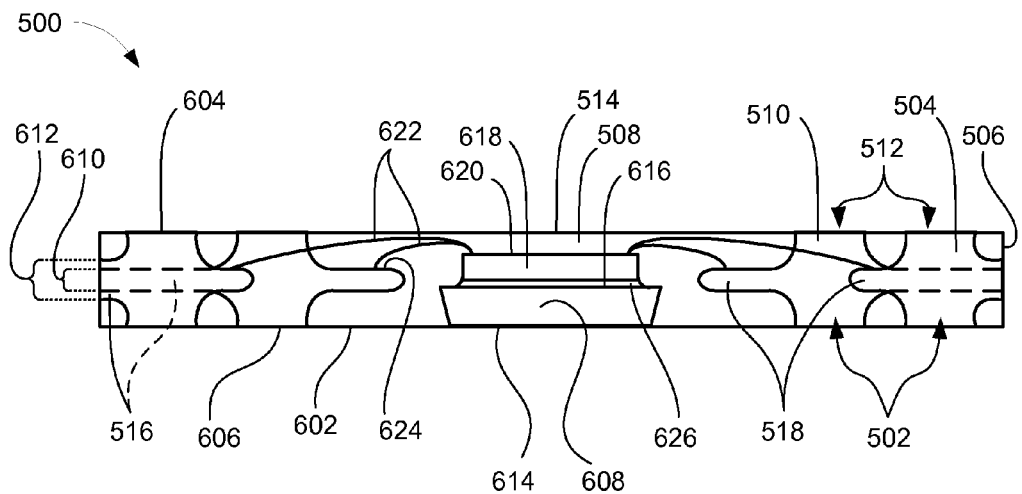
FIG. 6 is a cross-sectional view of the integrated circuit packaging system along the line 6-6 of FIG. 5.

Referring now to FIG. 6, therein is shown a cross-sectional view of the integrated circuit packaging system 500 along the line 6-6 of FIG. 5. The integrated circuit packaging system 500 is shown having the terminal sections 512 of the leads 502 exposed from the top surface 514 and from a bottom surface 602 of the encapsulation 508.

The portion of the terminal sections 512 exposed from the top surface 514 of the encapsulation 508 is an upper terminal 604, while the portion of the terminal sections 512 exposed from the bottom surface 602 is a bottom terminal 606.

Near an edge of the upper terminal 604 the leads 502 transition toward the bonding tips 518 with a non-linear slope such as a concave or convex curve. Similarly, near an opposite edge of the upper terminal 604, the leads 502 transition down toward the connecting bars 516 with a non-linear slope.

Near an edge of the bottom terminal 606, the leads 502 transition toward the bonding tips 518 with a non-linear slope such as a concave or convex curve from the bottom terminal 606 curving toward a die-attach-paddle 608. Near an edge of the bottom terminal 606, the inner leads 510 transition toward the connecting bars 516 with a non-linear slope away from the die-attach-paddle 608. Near an edge of the bottom terminal 606, the outer leads 504 transition toward the connecting bars 516 with a non-linear slope toward the perimeter 506 of the encapsulation 508.

Along the perimeter 506 of the encapsulation 508, a height 610 of the connecting bars 516 on the inner leads 510 is smaller than a height 612 of the connecting bars 516 on the outer leads 504. Further, the connecting bars 516 on the inner leads 510 are substantially centerline to the connecting bars 516 on the outer leads 504, meaning that the connecting bars 516 on the outer leads 504 are evenly proportioned above and below the connecting bars 516 on the inner leads 510.

The die-attach-paddle 608 is shown having a bottom 614 and a top 616. The bottom 614 of the die-attach-paddle 608 is exposed from the bottom surface 602 of the encapsulation 508. Near an edge of the bottom 614, the die-attach-paddle 608 transitions toward the top 616 with a linear slope toward the perimeter 506 of the encapsulation 508.

Above the die-attach-paddle 608 is an integrated circuit 618 with an active side 620 facing away from the die-attach-paddle 608. The active side 620 of the integrated circuit 618 is connected to the leads 502 with bond wires 622. The bond wires 622 are connected to the bonding tips 518 at a wire bonding surface 624. From the side, the bonding tips 518 have rounded corners and the bottom terminal 606 is substantially the same length as the upper terminal 604.

The integrated circuit 618 is attached to the die-attach-paddle 608 with die attach adhesive 626. Encapsulating the integrated circuit 618 and the bond wires 622 is the encapsulation 508.

Figure 7:
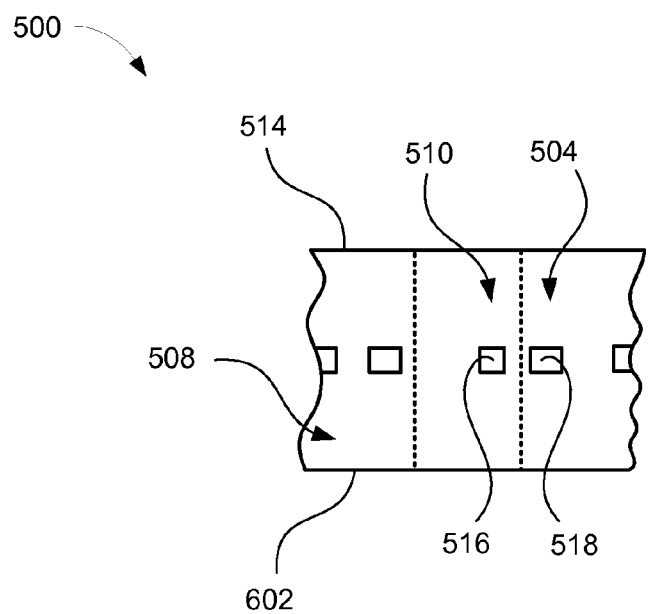
FIG. 7 is a cross-sectional view of the integrated circuit packaging system along the line 7-7 of FIG. 5.

Referring now to FIG. 7, therein is shown a cross-sectional view of the integrated circuit packaging system 500 along the line 7-7 of FIG. 5. The integrated circuit packaging system 500 is shown having the bonding tips 518 of the outer leads 504 encapsulated by the encapsulation 508. The bonding tips 518 of the outer leads 504 are also shown having a substantially rectangular cross-section perpendicular to the length of the terminal sections 512 of FIG. 5.

The connecting bar 516 of the inner lead 510 is also shown, and is not equidistant from the bonding tips 518 of the outer leads 504, but is closer to one of the bonding tips 518. The connecting bar 516 of the inner lead 510 is equidistant from the top surface 514 and the bottom surface 602 of the encapsulation 508. The connecting bar 516 of the inner lead 510 is also shown having a substantially rectangular cross-section perpendicular to the length of the connecting bars 516 of the inner leads 510.

Figure 8:
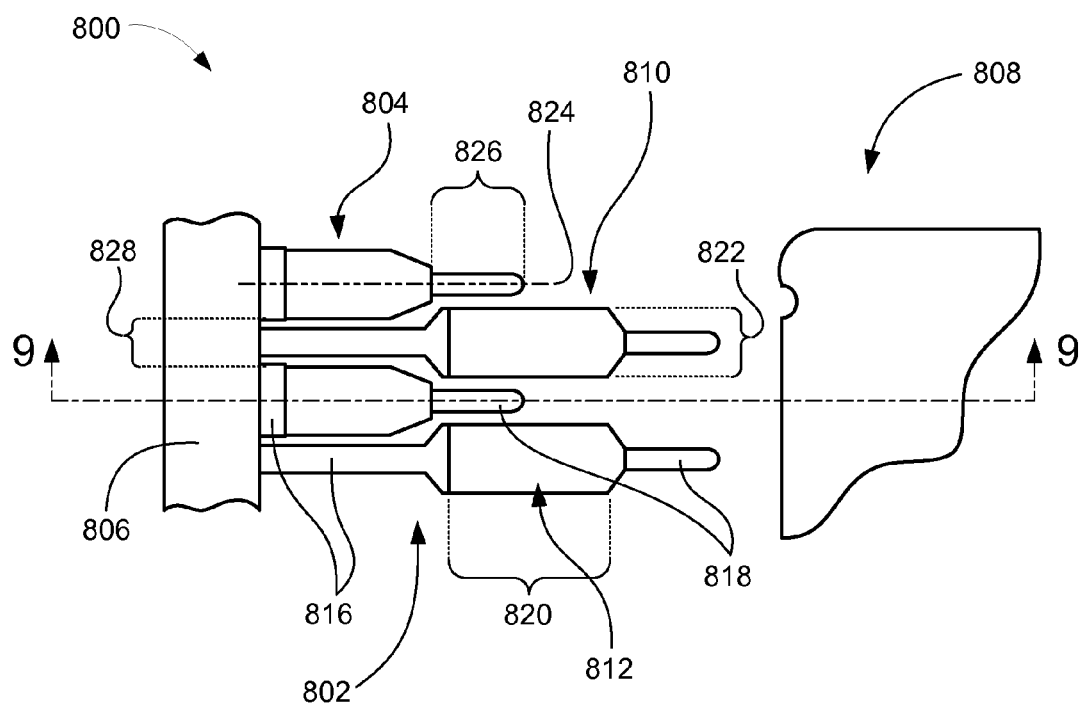
FIG. 8 is a top view of a magnified region of a leadframe used in the manufacture of integrated circuit package systems in various embodiments of the present invention.

Referring now to FIG. 8, therein is shown a top view of a magnified region of a leadframe 800 used in the manufacture of integrated circuit package systems in various embodiments of the present invention. The leadframe 800 is shown having leads 802 such as outer leads 804 near a dambar 806 of the leadframe 800, and inner leads 810 further away from the dambar 806 of the leadframe 800.

The leads 802 have terminal sections 812. The leads 802 also have connecting bars 816 which connect the terminal sections 812 to the dambar 806 of the leadframe 800. Formed on an opposite side of the leads 802 are bonding tips 818. From above, the terminal sections 812 are shown having a length 820 and a width 822.

The bonding tips 818 are pictured as substantially rectangular with a rounded tip and with a width substantially smaller than the width 822 of the terminal sections 812. The bonding tips 818 and the connecting bars 816 on the leads 802 are formed on a centerline 824 of the terminal sections 812.

From above, the terminal sections 812 of the outer leads 804 transition gradually toward the bonding tips 818. From above, the terminal sections 812 of the inner leads 810 transition steeply toward the bonding tips 818 and the connecting bars 816.

The outer leads 804 have a distance 828 between the terminal sections 812 that is less than the width 822 of the terminal sections 812 of the inner leads 810. The terminal sections 812 of the inner leads 810 are further from the dambar 806 of the leadframe 800 than are the bonding tips 818 of the outer leads 804. The connecting bars 816 of the inner leads 810 are smaller than the distance 828 between the terminal sections 812 of the outer leads 804.

The connecting bars 816 of the outer leads 804 are slightly larger than the width 822 of the terminal sections 812 of the outer leads 804 and extend toward the dambar 806 of the leadframe 800 in a straight path.

Figure 9:
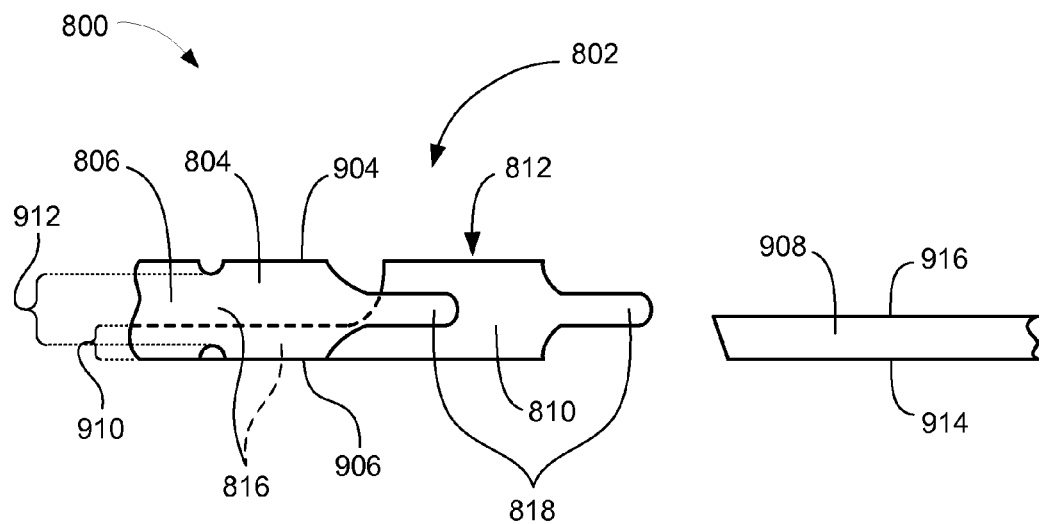
FIG. 9 is a cross-sectional view of the leadframe along the line 9-9 of FIG. 8.

Referring now to FIG. 9, therein is shown a cross-sectional view of the leadframe 800 along the line 9-9 of FIG. 8. The leadframe 800 is shown having the terminal sections 812 of the leads 802 on the leadframe 800.

The top portion of the terminal sections 812 is an upper terminal 904, while the bottom portion of the terminal sections 812 is a bottom terminal 906.

Near an edge of the upper terminal 904 the leads 802 transition toward the bonding tips 818 with a non-linear slope such as a concave or convex curve. Similarly, near an opposite edge of the upper terminal 904, the leads 802 transition down toward the connecting bars 816 with a non-linear slope.

Near an edge of the bottom terminal 906, the leads 802 transition toward the bonding tips 818 with a non-linear slope such as a concave or convex curve from the bottom terminal 906 curving toward a die-attach-paddle 908. The bottom terminal 906 of the inner leads 810 do not transition or slope toward the connecting bars 816 but the bottom terminal 906 of the inner leads 810 is on the same plane as the connecting bars 816 of the inner leads 810. Near an edge of the bottom terminal 906, the outer leads 804 transition toward the connecting bars 816 with a non-linear slope toward the dambar 806 of the leadframe 800.

Along the dambar 806 of the leadframe 800, a height 910 of the connecting bars 816 on the inner leads 810 is smaller than a height 912 of the connecting bars 816 on the outer leads 804. Further, the connecting bars 816 on the inner leads 810 are substantially lower than the connecting bars 816 on the outer leads 804, meaning that the connecting bars 816 on the outer leads 804 are unevenly proportioned above the connecting bars 816 on the inner leads 810.

The die-attach-paddle 908 is shown having a bottom 914 and a top 916. Near an edge of the bottom 914, the die-attach-paddle 908 transitions toward the top 916 with a linear slope toward the dambar 806 of the leadframe 800. From the side, the bonding tips 818 have rounded corners and the bottom terminal 906 is substantially the same length as the upper terminal 904.

Figure 10:
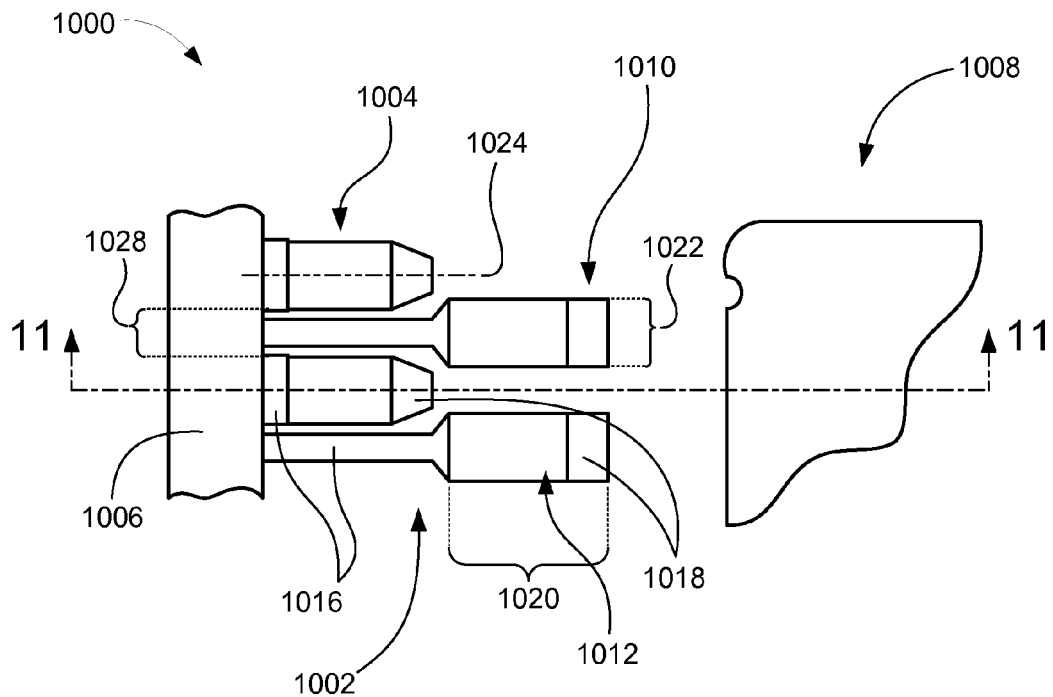
FIG. 10 is a top view of a magnified region of a leadframe used in the manufacture of integrated circuit package systems in various embodiments of the present invention.

Referring now to FIG. 10, therein is shown a top view of a magnified region of a leadframe 1000 used in the manufacture of integrated circuit package systems in various embodiments of the present invention. The leadframe 1000 is shown having leads 1002 such as outer leads 1004 near a dambar 1006 of the leadframe 1000, and inner leads 1010 further away from the dambar 1006 of the leadframe 1000.

The leads 1002 have terminal sections 1012. The leads 1002 also have connecting bars 1016 which connect the terminal sections 1012 to the dambar 1006 of the leadframe 1000. Formed on an opposite side of the leads 1002 are bonding tips 1018. From above, the terminal sections 1012 are shown having a length 1020 and a width 1022.

The bonding tips 1018 on the inner leads 1010 are pictured as substantially rectangular with square corners and with a width substantially similar to the width 1022 of the terminal sections 1012. The bonding tips 1018 on the outer leads 1004 are pictured as substantially trapezoidal with sides that angle toward a centerline 1024 of the terminal sections 1012.

From above, the terminal sections 1012 of the inner leads 1010 transition steeply toward the connecting bars 1016.

The outer leads 1004 have a distance 1028 between the terminal sections 1012 that is less than the width 1022 of the terminal sections 1012 of the inner leads 1010. The terminal sections 1012 of the inner leads 1010 are further from the dambar 1006 of the leadframe 1000 than are the bonding tips 1018 of the outer leads 1004. The connecting bars 1016 of the inner leads 1010 are smaller than the distance 1028 between the terminal sections 1012 of the outer leads 1004.

The connecting bars 1016 of the outer leads 1004 are slightly larger than the width 1022 of the terminal sections 1012 of the outer leads 1004 and extend toward the dambar 1006 of the leadframe 1000 in a straight path.

Figure 11:
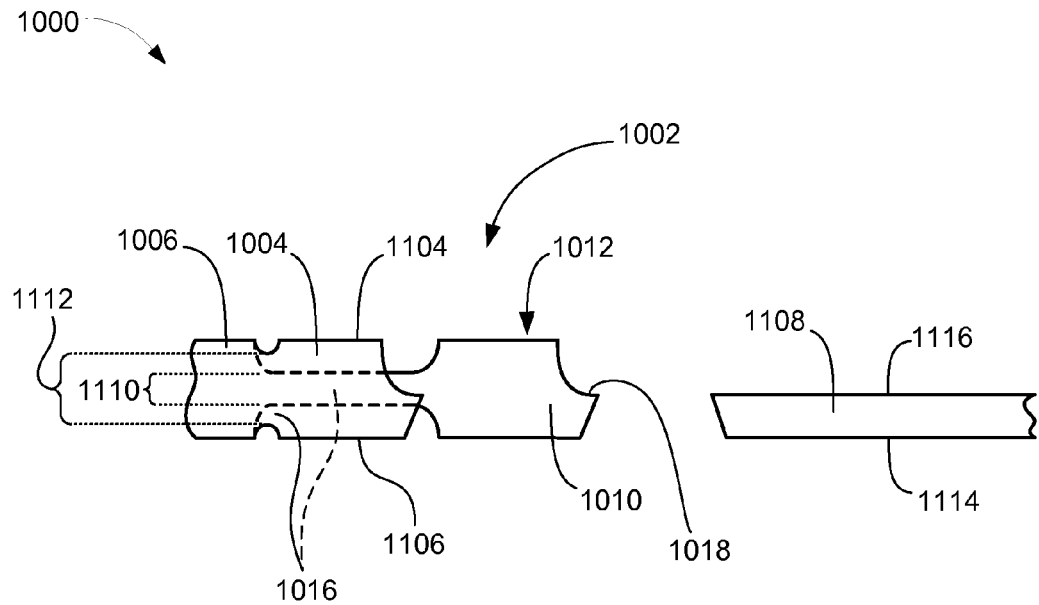
FIG. 11 is a cross-sectional view of the leadframe along the line 11-11 of FIG. 10.

Referring now to FIG. 11, therein is shown a cross-sectional view of the leadframe 1000 along the line 11-11 of FIG. 10. The leadframe 1000 is shown having the terminal sections 1012 of the leads 1002 on the leadframe 1000.

The top portion of the terminal sections 1012 is an upper terminal 1104, while the bottom portion of the terminal sections 1012 is a bottom terminal 1106.

Near an edge of the upper terminal 1104 the leads 1002 transition toward the bonding tips 1018 with a non-linear slope such as a concave or convex curve. Similarly, near an opposite edge of the upper terminal 1104, the leads 1002 transition down toward the connecting bars 1016 with a non-linear slope.

Near an edge of the bottom terminal 1106, the leads 1002 transition toward the bonding tips 1018 with a substantially linear slope from the bottom terminal 1106 toward a die-attach-paddle 1108. Near an edge of the bottom terminal 1106, the inner leads 1010 transition toward the connecting bars 1016 with a non-linear slope toward the dambar 1006 of the leadframe 1000. Near an edge of the bottom terminal 1106, the outer leads 1004 transition toward the connecting bars 1016 with a non-linear slope toward the dambar 1006 of the leadframe 1000.

Along the dambar 1006 of the leadframe 1000, a height 1110 of the connecting bars 1016 on the inner leads 1010 is smaller than a height 1112 of the connecting bars 1016 on the outer leads 1004. Further, the connecting bars 1016 on the inner leads 1010 are substantially centerline with the connecting bars 1016 on the outer leads 1004, meaning that the connecting bars 1016 on the outer leads 1004 are evenly proportioned above and below the connecting bars 1016 on the inner leads 1010.

The die-attach-paddle 1108 is shown having a bottom 1114 and a top 1116. Near an edge of the bottom 1114, the die-attach-paddle 1108 transitions toward the top 1116 with a linear slope toward the dambar 1006 of the leadframe 1000. From the side, the bonding tips 1018 have pointed corners and the bottom terminal 1106 is substantially longer than the upper terminal 1104.

Figure 12:
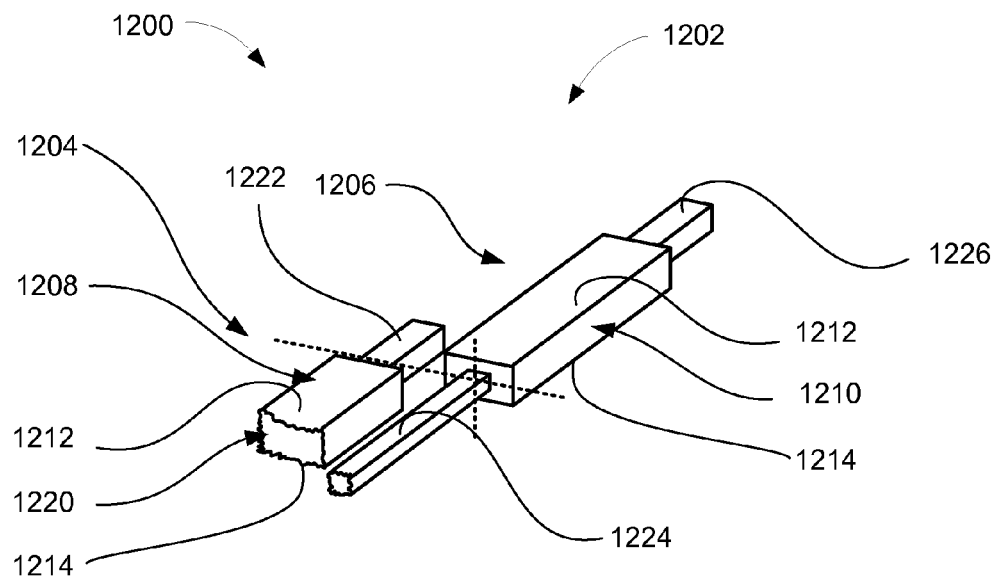
FIG. 12 is an isometric view of a magnified region of a leadframe used in the manufacture of integrated circuit package systems in various embodiments of the present invention.

Referring now to FIG. 12, therein is shown an isometric view of a magnified region of a leadframe 1200 used in the manufacture of integrated circuit package systems in various embodiments of the present invention. The leadframe 1200 is shown having leads 1202 such as outer leads 1204 and inner leads 1206.

The outer leads 1204 have outer terminal sections 1208, while the inner leads 1206 have inner terminal sections 1210. The outer terminal sections 1208 have an upper terminal 1212 and a bottom terminal 1214. The inner terminal sections 1210 have an upper terminal 1216 and a bottom terminal 1218.

The outer leads 1204 also have connecting bars 1220 which connect the outer terminal sections 1208 to a dambar (not shown). Formed on an opposite side of the outer leads 1204 are bonding tips 1222.

The inner leads 1206 also have connecting bars 1224 which connect the inner terminal sections 1210 to a dambar (not shown). Formed on an opposite side of the inner leads 1206 are bonding tips 1226.

It has been discovered that the geometry of the outer terminal sections 1208 and the inner terminal sections 1210 provide increased area for exterior connections (not shown) while the combination of the outer terminal sections 1208 and the bonding tips 1220 allows for shortened connections between integrated circuits (not shown) and exterior systems (also not shown). Further, the connecting bars 1224 of the inner leads 1206 allow the leadframe 1200 to contain multiple rows of the leads 1202, thus increasing density of external connections without decreasing the size of the external connections.

Figure 13:
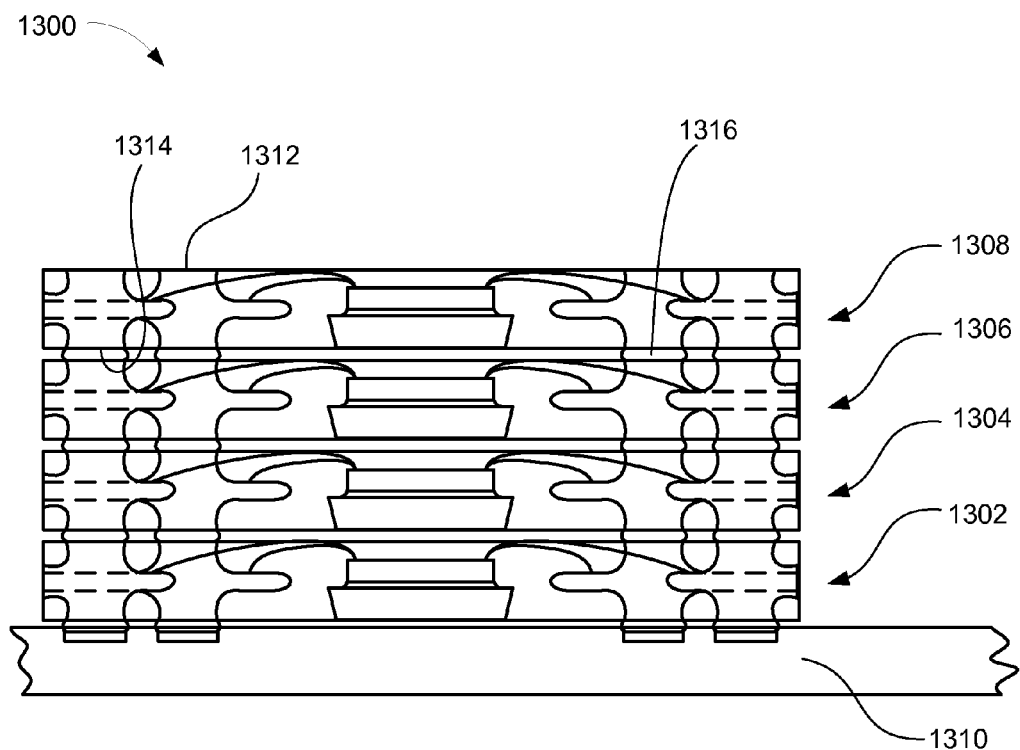
FIG. 13 is a cross-sectional view of an integrated circuit packaging system in a mounting phase of manufacture and in an embodiment of the present invention.

Referring now to FIG. 13, therein is shown a cross-sectional view of an integrated circuit packaging system 1300 in a mounting phase of manufacture and in an embodiment of the present invention. The integrated circuit packaging system 1300 is shown having packages such as a first package 1302, a second package 1304, a third package 1306, and finally a fourth package 1308, all mounted above a circuit board 1310. The packages are similar to the integrated circuit packaging system 500 of FIG. 5.

The first package 1302 is mounted above the circuit board 1310, the second package 1304 is mounted above the first package 1302, the third package 1306 is mounted above the second package 1304, and finally the fourth package 1308 is mounted above the third package 1306. The packages are shown having upper terminals 1312 and bottom terminals 1314. The packages are connected with interconnects such as solder joints 1316.

For example, the bottom terminals 1314 of the fourth package 1308 are connected to the upper terminals 1312 of the third package 1306 with the solder joints 1316, and the bottom terminals 1314 of the third package 1306 are connected to the upper terminals 1312 of the second package 1304 with the solder joints 1316, and the upper terminals 1312 of the first package 1302 are connected to the bottom terminals 1314 of the second package 1304 with the solder joints 1316.

Finally, the first package 1302 is connected to the circuit board 1310 with the solder joints 1316. Other components or package types (not shown) may be mounted to the upper terminals 1312 of the fourth package 1308.

Figure 14:
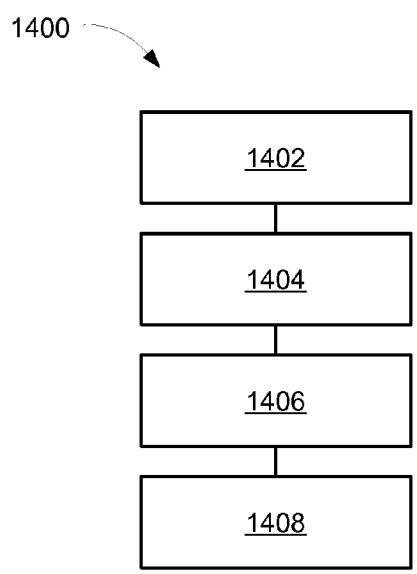
FIG. 14 is a flow chart of a method of manufacture of an integrated circuit packaging system of FIG. 1 in a further embodiment of the present invention.

Referring now to FIG. 14, therein is shown a flow chart of a method 1400 of manufacture of an integrated circuit packaging system 100 of FIG. 1 in a further embodiment of the present invention. The method 1400 includes forming outer leads having outer terminal sections, the outer terminal sections having an upper terminal and a bottom terminal in a block 1402; forming inner leads having inner terminal sections wider than a distance between the outer terminal sections of the outer leads, and the inner terminal sections have an upper terminal and a bottom terminal in a block 1404; connecting an integrated circuit to the inner leads and the outer leads in a block 1406; and encapsulating the integrated circuit, the inner leads, and the outer leads with an encapsulation while leaving the upper terminals and the bottom terminals of the outer terminal sections and the upper terminals and bottom terminals of the inner terminal sections exposed from the encapsulation in a block 1408.

Thus, it has been discovered that the dual row lead-frame having top and bottom terminals system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit packaging system comprising:
   forming outer leads having outer terminal sections, the outer terminal sections having an upper terminal and a bottom terminal;
   forming inner leads having inner terminal sections wider than a distance between the outer terminal sections of the outer leads, and the inner terminal sections have an upper terminal and a bottom terminal;
   connecting an integrated circuit to the inner leads and the outer leads; and
   encapsulating the integrated circuit, the inner leads, and the outer leads with an encapsulation while leaving the upper terminals and the bottom terminals of the outer terminal sections and the upper terminals and bottom terminals of the inner terminal sections exposed from the encapsulation.

2. The method as claimed in claim 1 wherein:
   forming the outer leads includes forming the bottom terminal longer than the length of the upper terminal, substantially the same length as the upper terminal, or a combination there of; and
   forming the inner leads includes forming the bottom terminal longer than the length of the upper terminal, substantially the same length as the upper terminal, or a combination there of.

3. The method as claimed in claim 1 further comprising:
   forming bonding tips on the outer terminal sections; and wherein:
   forming the inner leads includes forming the inner terminal sections further from a perimeter of the encapsulation than the bonding tips of the outer terminal sections.

4. The method as claimed in claim 1 further comprising:
   forming bonding tips on the inner terminal sections;
   forming bonding tips on the outer terminal sections;
wherein:
   forming the inner terminal sections includes forming a transition toward the bonding tips with a nonlinear slope, a linear slope, or a combination thereof; and
   forming the outer terminal sections includes forming a transition toward the bonding tips with a nonlinear slope, a linear slope, or a combination thereof.

5. The method as claimed in claim 1 further comprising:
   forming connecting bars on the outer terminal sections;
   forming connecting bars on the inner terminal sections;
wherein:
   forming the inner terminal sections includes forming a transition toward the connecting bars with a nonlinear slope, a linear slope, or a combination thereof; and
   forming the outer terminal sections includes forming a transition toward the connecting bars with a nonlinear slope, a linear slope, or a combination thereof.

6. A method of manufacture of an integrated circuit packaging system comprising:
   forming outer leads having outer terminal sections, bonding tips, and connecting bars, and the outer terminal sections having an upper terminal and a bottom terminal;
   forming inner leads having inner terminal sections wider than a distance between the outer terminal sections of the outer leads, and having bonding tips and connecting bars, and the inner terminal sections have an upper terminal and a bottom terminal;
   providing an integrated circuit;
   connecting the integrated circuit to the bonding tips of the inner leads and the bonding tips of the outer leads; and
   encapsulating the integrated circuit, the inner leads, and the outer leads with an encapsulation while leaving the upper terminals and the bottom terminals of the outer terminal sections and the upper terminals and bottom terminals of the inner terminal sections exposed from the encapsulation.

7. The method as claimed in claim 6 wherein:
   forming the outer leads includes forming the bonding tips and the connecting bars offset of a centerline of the outer terminal sections; and
   forming the inner leads includes forming the connecting bars of the inner leads offset of a centerline of the inner terminal sections.

8. The method as claimed in claim 6 wherein:
   forming the outer leads includes forming the bonding tips of the outer leads with rounded corners, square corners, or a combination thereof; and
   forming the inner leads includes forming the bonding tips of the inner leads with rounded corners, square corners, or a combination thereof.

9. The method as claimed in claim 6 wherein:
   forming the inner leads includes forming the bonding tips of the inner leads longer than the bonding tips of the outer leads, substantially the same size as the bonding tips of the outer leads, or a combination thereof.

10. The method as claimed in claim 6 wherein:
    forming the inner leads includes forming the bonding tips of the inner leads width substantially similar to the width of the inner terminal sections.

11. An integrated circuit packaging system comprising:
outer leads that have outer terminal sections, the outer terminal sections have an upper terminal and a bottom terminal;
inner leads that have inner terminal sections wider than a distance between the outer terminal sections of the outer leads, and the inner terminal sections have an upper terminal and a bottom terminal;
an integrated circuit connected to the inner leads and the outer leads; and
an encapsulation encapsulating the integrated circuit, the inner leads, and the outer leads and the upper terminals and the bottom terminals of the outer terminal sections and the upper terminals and bottom terminals of the inner terminal sections are exposed from the encapsulation.

12. The system as claimed in claim 11 wherein:
the bottom terminal of the outer leads are longer than the length of the upper terminal, substantially the same length as the upper terminal, or a combination there of; and
the bottom terminal of the inner leads are longer than the length of the upper terminal, substantially the same length as the upper terminal, or a combination there of.

13. The system as claimed in claim 11 further comprising:
bonding tips on the outer terminal sections; and
wherein:
the inner terminal sections are further from a perimeter of the encapsulation than the bonding tips of the outer terminal sections.

14. The system as claimed in claim 11 further comprising:
bonding tips on the inner terminal sections;
bonding tips on the outer terminal sections;
wherein:
the inner terminal sections transition toward the bonding tips with a nonlinear slope, a linear slope, or a combination thereof; and
the outer terminal sections transition toward the bonding tips with a nonlinear slope, a linear slope, or a combination thereof.

15. The system as claimed in claim 11 further comprising:
connecting bars on the outer terminal sections;
connecting bars on the inner terminal sections;
wherein:
the inner terminal sections transition toward the connecting bars with a nonlinear slope, a linear slope, or a combination thereof; and
the outer terminal sections transition toward the connecting bars with a nonlinear slope, a linear slope, or a combination thereof.

16. The system as claimed in claim 11 further comprising:
bonding tips, and connecting bars formed on the outer terminal sections of the outer leads; and
bonding tips and connecting bars formed on the inner terminal sections of the inner leads.

17. The system as claimed in claim 16 wherein:
the bonding tips and the connecting bars of the outer leads are formed offset of a centerline of the outer terminal sections; and
the connecting bars of the inner leads are formed offset of a centerline of the inner terminal sections.

18. The system as claimed in claim 16 wherein:
the bonding tips of the outer leads have rounded corners, square corners, or a combination thereof; and
the bonding tips of the inner leads have rounded corners, square corners, or a combination thereof.

19. The system as claimed in claim 16 wherein:
the bonding tips of the inner leads are longer than the bonding tips of the outer leads, substantially the same size as the bonding tips of the outer leads, or a combination thereof.

20. The system as claimed in claim 16 wherein:
the bonding tips of the inner leads have a width substantially similar to the width of the inner terminal sections.

* * * * *